United States Patent
Furuyama

(10) Patent No.: US 6,310,825 B1
(45) Date of Patent: Oct. 30, 2001

(54) DATA WRITING METHOD FOR SEMICONDUCTOR MEMORY DEVICE

(75) Inventor: Takaaki Furuyama, Kasugi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/671,647

(22) Filed: Sep. 28, 2000

(30) Foreign Application Priority Data

Nov. 17, 1999 (JP) .................................................. 11-326876

(51) Int. Cl.[7] ...................................................... G11C 8/00

(52) U.S. Cl. ........................................... 365/233; 365/194

(58) Field of Search ...................................... 365/233, 226, 365/194, 189.04, 189.05

(56) References Cited

U.S. PATENT DOCUMENTS

| | | | | |
|---|---|---|---|---|
| 5,568,445 | * | 10/1996 | Park et al. | 365/233 |
| 5,793,688 | * | 8/1998 | McLaury | 365/203 |
| 5,813,023 | * | 9/1998 | McLaury | 711/105 |
| 5,966,343 | * | 10/1999 | Thurston | 365/233 |
| 6,130,856 | * | 10/2000 | McLaury | 365/233 |
| 6,215,722 | * | 4/2001 | Park | 365/230.06 |

* cited by examiner

*Primary Examiner*—Vu A. Le
*Assistant Examiner*—Anh Phung
(74) *Attorney, Agent, or Firm*—Arent Fox Kintner Plotkin & Kahn, PLLC

(57) ABSTRACT

A semiconductor memory device includes a control circuit that sets read and write latency periods such that the write data input circuit is activated and acquires the write data after the receipt of a write command and upon the lapse of the write latency period. The write latency period of the memory device is set to be one latency value less than the read latency period.

12 Claims, 7 Drawing Sheets

DATA WRITING METHOD FOR SEMICONDUCTOR MEMORY DEVICE

BACKGROUND OF THE INVENTION

The present invention relates to a semiconductor memory device, and, more particularly, to a synchronous DRAM (dynamic random access memory) that performs a data write operation and a data read operation synchronously with a clock signal.

Recently, for higher operation speed, synchronous DRAMs (SDRAM) have shifted from a single data rate (SDR) SDRAM to a double data rate (DDR) SDRAM.

FIG. 1 is a schematic block diagram of a conventional DDR-SDRAM 100. FIG. 1 shows only a circuit related to a write operation. A column address signal AD is supplied to a first input circuit 1a, a command signal CM is supplied to a second input circuit 1b, and write data DQ is supplied to a third input circuit 1c.

The column address signal AD is output from the first input circuit 1a and supplied to a predecoder 3 via a first-in first-out (FIFO) memory 2a. The FIFO memory 2a delays the column address signal AD by one cycle (one clock) of an SDRAM clock signal and supplies a delayed column address signal to the predecoder 3. The predecoder 3 supplies a predecode signal of the delayed column address signal to a main decoder 4 and the main decoder 4 supplies a column selection signal to a sense amplifier 5.

The second input circuit 1b supplies the command signal CM to a FIFO memory 2b. The FIFO memory 2b delays the command signal CM by one clock and supplies a delayed command signal CM to a control circuit 6. The control circuit 6 supplies an activation signal to the main decoder 4 and a write amplifier 7 in accordance with the delayed command signal CM.

The third input circuit 1c supplies the write data DQ to the write amplifier 7.

In the write operation mode, the write amplifier 7 and the main decoder 4 are activated in accordance with the command signal CM and the sense amplifier 5 of a specific column is activated in accordance with the address signal AD. At this time, write data DQ is supplied from the third input circuit 1c to the write amplifier 7 and written from the sense amplifier 5 to a specific memory cell (not shown) of a memory cell array 10.

FIG. 2 is a timing diagram showing the write operation of the DDR-SDRAM 100. In the write operation mode, when a word line activation command ACTV is supplied from an external device as the command signal CM, a write command WR is supplied using the word line activation command ACTV after a predetermined latency period. Further, write latency WL is set in the DDR-SDRAM 100 until write data DQ is supplied after the write command WR has been supplied. For example, when the write latency WL is set to "1", an I/O control signal DQS and the write data DQ are supplied from the external device to the third input circuit 1c one clock period after the write command WR.

The third input circuit 1c acquires write data DQ in response to the rising and falling edges of the I/O control signal DQS. The write amplifier 7, the main decoder 4 and the sense amplifier 5 are activated substantially synchronously with acquisition of the write data DQ, and the acquired write data DQ is written in the selected memory cell in units of two bits in accordance with an address signal AD.

In the read operation mode, a read command RD is supplied from the external device to the second input circuit 1b at the same latency until a write command WR is supplied after a word line activation command ACTV has been supplied. The cell information is read from the selected memory cell in accordance with the address signal AD by the supply of the read command RD.

Thus, in the read operation mode, the read operation is started immediately after the supply of the read command RD. Conversely, in the write operation mode, acquisition of write data DQ is started with the lapse of write latency WL after a write command WR has been supplied, and the write operation is started after the acquisition of data has been completed. Accordingly, the time for the write operation to be completed after a word line selection command ACTV has been supplied is longer than the time for the read operation to be completed after the word line selection command ACTV has been supplied.

In such DDR-SDRAM, to reduce power consumption, it is preferable that the third input circuit 1c be activated when write data DQ is acquired after a write command WR has been supplied. However, write latency is "1", that is, a single clock period. This single clock period is shortened with a high-frequency clock signal CLK. However, it becomes difficult to accurately activate the third input circuit 1c when the write data DQ is input after the write command WR has been supplied. To prevent such inconvenience, if the third input circuit 1c is activated in the write operation mode, power consumption increases along with high-frequency clock signals CLK and /CLK.

On the other hand, if write latency is set long, write data DQ is easily acquired even if the third input circuit 1c is activated after the latency period has elapsed from the supply of a write command WR.

However, in the conventional DDR-SDRAM 100, if write latency is set long, the time required until the write operation is completed after a word line activation command ACTV has been supplied is prolonged. This is because the latency until a write command WR is supplied after the word line activation command ACTV has been supplied is set substantially equal to the latency until a read command is supplied after the word line activation command ACTV has been supplied.

SUMMARY OF THE INVENTION

An object of the present invention is to provide a semiconductor memory device having reduced power consumption without decreasing a write speed.

In a first aspect of the present invention, a method for writing data to a semiconductor memory device using an input circuit for write data is provided. First, a word line activation command is supplied to the semiconductor memory device. A write command is supplied to the semiconductor memory device after the lapse of a first predetermined latency period according to a clock signal after the supply of the word line activation command. Then, the input circuit is activated in response to the write command. The write data is acquired after the lapse of a write latency period after activation of the input circuit. Then, a write operation of the write data supplied to the input circuit is performed. The first predetermined latency period is decreased when the write latency period is increased.

In a second aspect of the present invention, a method for writing data to a semiconductor memory device using an input circuit for write data is provided. The semiconductor memory device outputs written data upon the lapse of a read latency period after a read command has been supplied thereto. First, a word line activation command is supplied to the semiconductor memory device, and a write command id supplied to the semiconductor memory device after the lapse of a first predetermined latency period according to a clock signal after the supply of the word line activation command. Then, the input circuit is activated in response to the write command. The write data is acquired after the lapse of a write latency period after the write command as been supplied to the input circuit. Then, a write operation of the write data supplied to the input circuit is performed. The write latency period is shorter than the read latency period, and the first predetermined latency period is decreased when the write latency period is increased.

In a third aspect of the present invention, a semiconductor memory device is provided. The device includes a first input circuit that acquires a write command in accordance with a clock signal and a second input circuit that acquires write data in accordance with the clock signal. A write latency setting circuit is connected to the first input circuit to set a write latency period in accordance with the clock signal. A control circuit is connected to the first and second input circuits to activate the second input circuit in response to the write command to acquire the write data after the lapse of the write latency period. The write latency period is set so that the second input circuit surely acquires the write data after the activation of the second input circuit.

In a fourth aspect of the present invention, a semiconductor memory device is provided. The device includes a first input circuit that acquires an address signal in accordance with a clock signal, a second input circuit that acquires various commands including a write command in accordance with the clock signal, and a third input circuit that acquires write data in accordance with the clock signal. A write latency setting circuit is connected to the second and third input circuits to set a write latency period in accordance with the clock signal. A control circuit is connected to the second and third input circuits to activate the third input circuit in response to the write command to acquire the write data after the lapse of the write latency period after the second input circuit has acquired the write command. The write latency period is set so that the third input circuit surely acquires the write data after the activation of the third input circuit.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best understood by reference to the following description of the presently preferred embodiments together with the accompanying drawings in which.

DETAILED DESCRIPTION OF THE PREFERRED EMBODIMENTS

Figure 1:
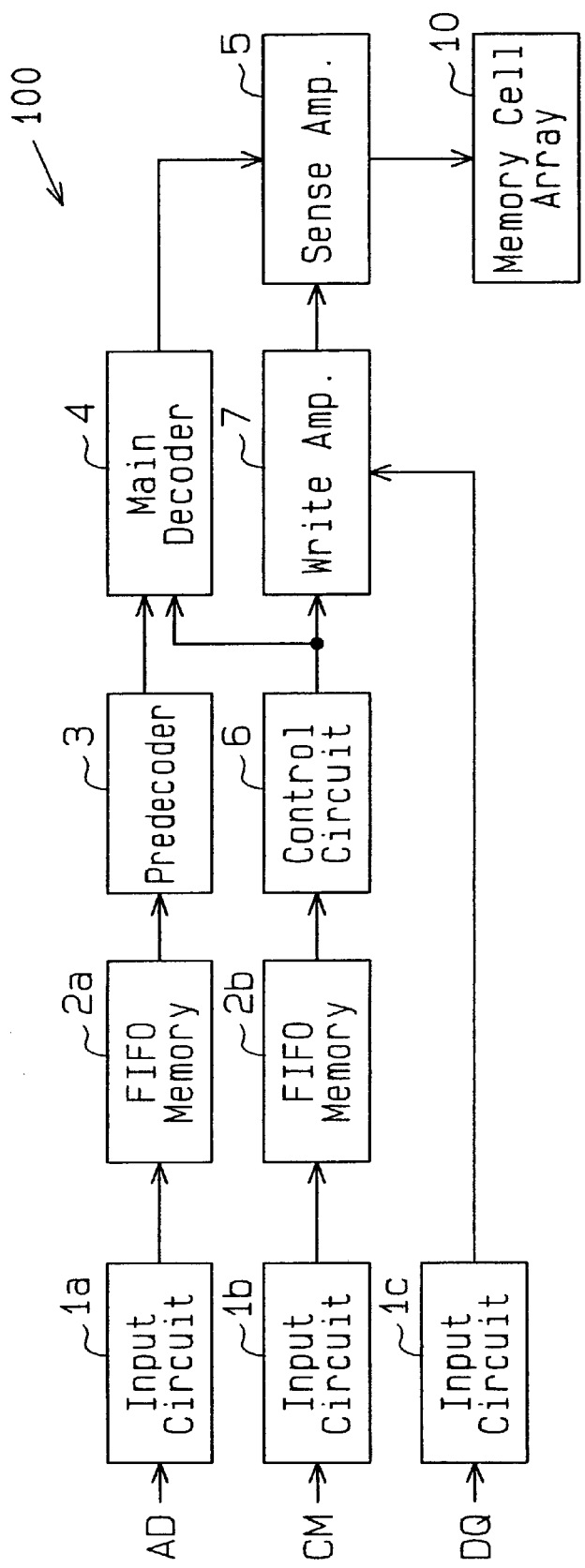
FIG. 1 is a schematic block diagram of a conventional DDR-SDRAM.
Figure 2:
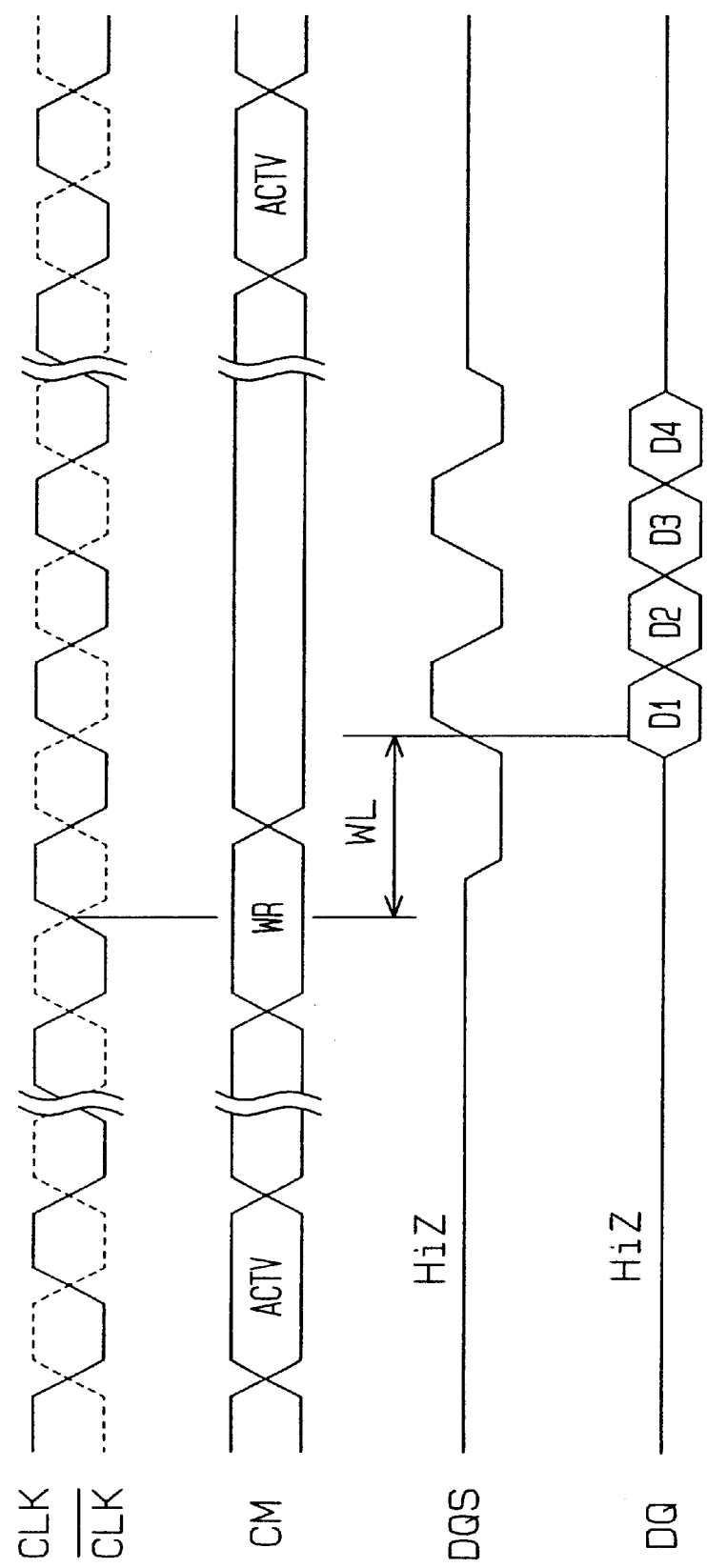
FIG. 2 is a timing diagram showing the write operation of the DDR-SDRAM of FIG. 1.

In the drawings, like numerals are used for like elements throughout.

Figure 3:
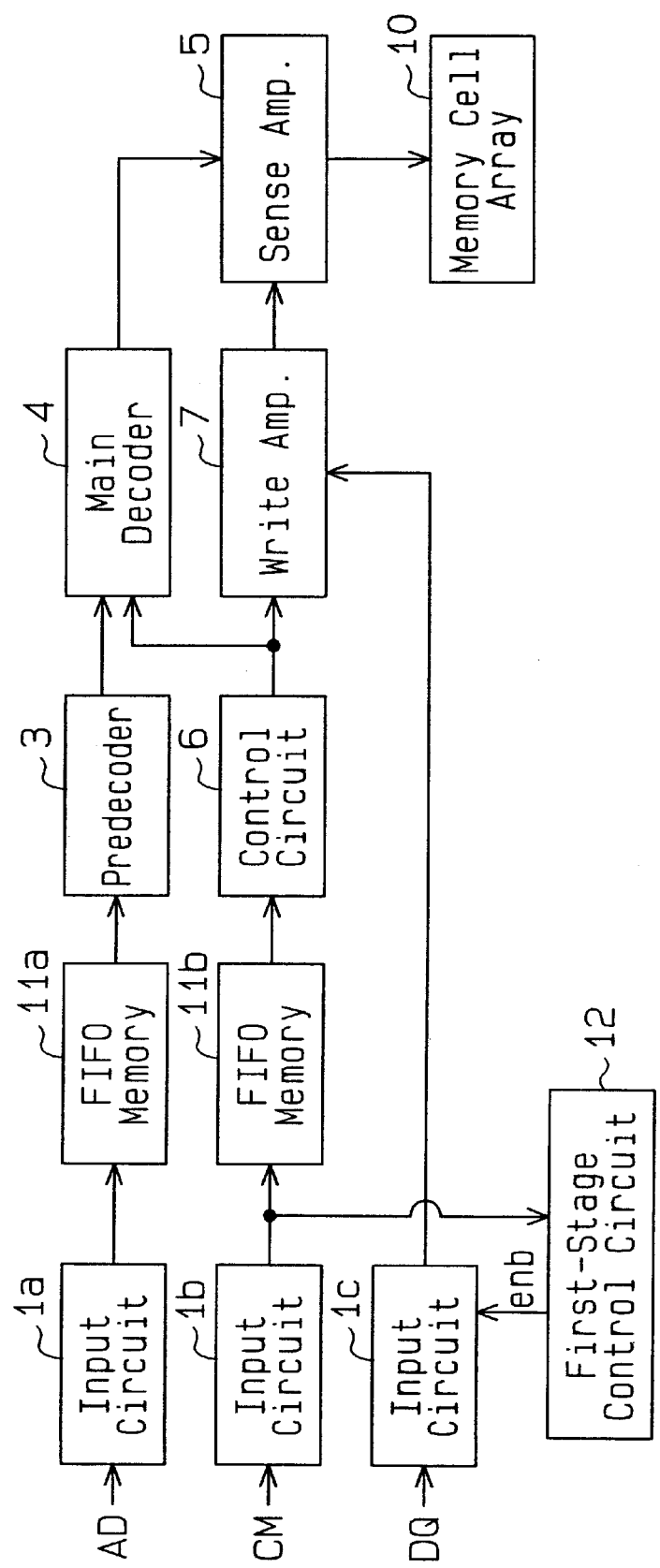
FIG. 3 is a schematic block diagram of a DDR-SDRAM according to one embodiment of the present invention.

FIG. 3 is a schematic block diagram of a DDR-SDRAM 200 according to one embodiment of the present invention. The DDR-SDRAM 200 comprises three input circuits 1a, 1b and 1c, two FIFO memories 11a and 11b, a first-stage control circuit 12, a precoder 3, a main decoder 4, a sense amplifier 5, a control circuit 6, a write amplifier 7 and a memory cell array 10.

Read latency RL of the DDR-SDRAM 200 is set according to a frequency of a clock signal CLK, and is set to "2" or "3" as the frequency increases. In this embodiment, the read latency RL is set to "3" and write latency WL is set to "2" (RL "3"−1). The read latency RL is the latency period until a read operation is started after a read command has been supplied. The write latency WL is the latency period until write data DQ is supplied after a write command WR has been supplied.

The FIFO memories 11a, 11b delay the output signals from the input circuits 1a, 1b in accordance with the write latency WL "2" by two cycles of the clock signal CLK and outputs delayed signals.

Figure 4:
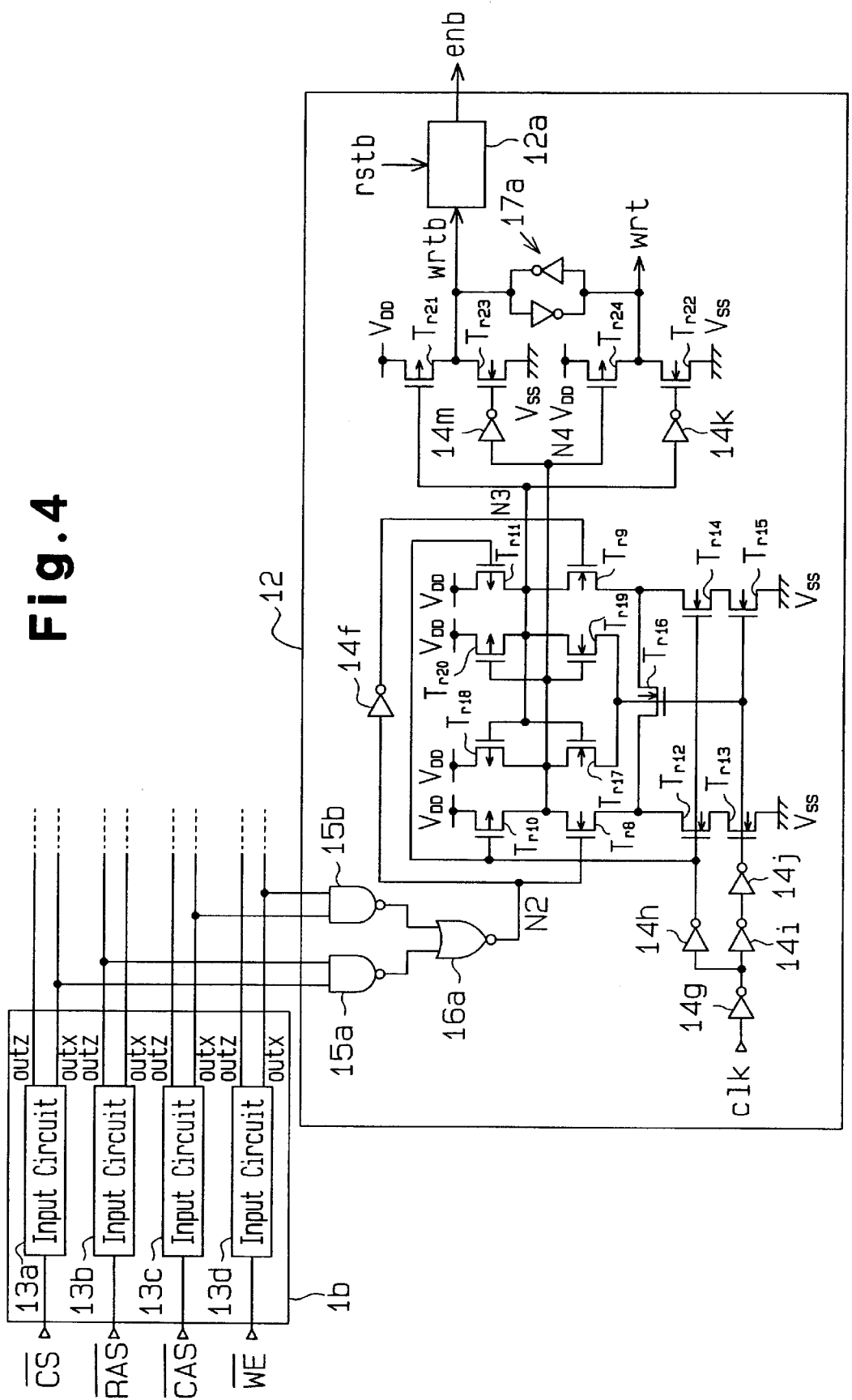
FIG. 4 is a schematic block diagram of a first-stage control circuit in the DDR-SDRAM of FIG. 3.

As shown in FIG. 4, the input circuit 1b comprise four input circuits 13a to 13d that receive control signals /CS, /RAS, /CAS and /WE respectively and supply delayed control signals to the FIFO memory 11b.

Figure 6:
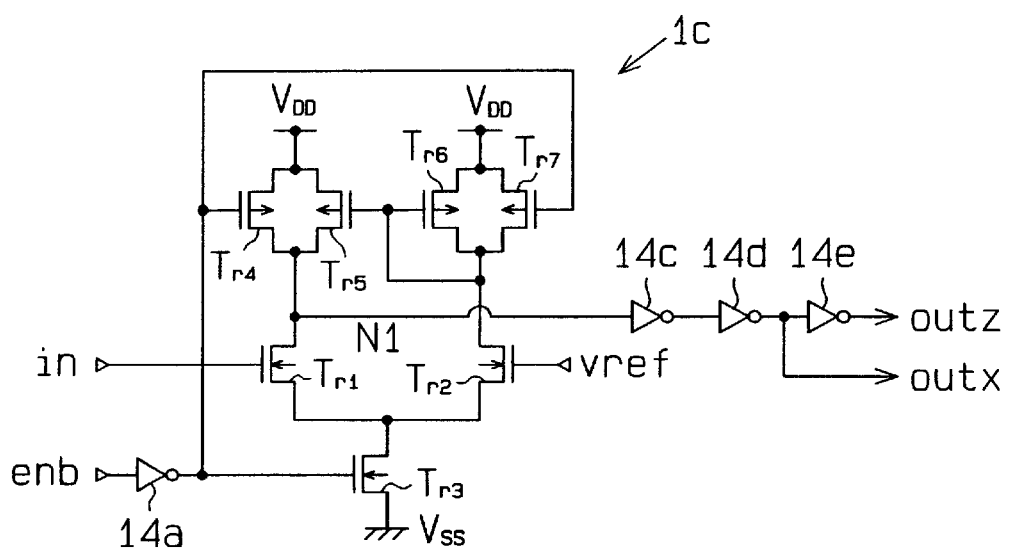
FIG. 6 is a schematic circuit diagram of an input circuit in the DDR-SDRAM of FIG. 1.

The input circuit 1c includes a differential circuit shown in FIG. 6. That is, an input signal in (i.e., write data DQ) and a reference voltage Vref are supplied to the gates of a pair of N-channel MOS transistors Tr1, Tr2, respectively. The sources of the transistors Tr1, Tr2 are connected to the drain of an N-channel MOS transistor Tr3 and the source of the transistor Tr3 is connected to a low potential power supply Vss. The input circuits 1a and 13a to 13d have the same circuit configuration as the input circuit 1c.

The drain of the transistor Tr1 is connected to the drains of P-channel MOS transistors Tr4, Tr5 and a high potential power supply VDD is connected to the sources of the transistors Tr4, Tr5. The drain of the transistor Tr2 is connected to the drains of P-channel MOS transistors Tr6, Tr7 and the high potential power supply VDD is connected to the sources of the transistors Tr6, Tr7. The gates of the transistors Tr5, Tr6 are connected together and to the drain of the transistor Tr2. An activation signal enb is supplied to the gates of the transistors Tr3, Tr4 and Tr7 via an inverter circuit 14a.

The voltage of the drain (node N1) of the transistor Tr1 is output via three inverter circuits 14c to 14e as an output signal outz and is output via the two inverter circuits 14c and 14d as an output signal outx.

In the input circuit 1c, when the activation signal enb goes high, the transistor Tr3 is turned off and the transistors Tr4, Tr7 are turned on. Accordingly, regardless of the level of the input signal in, the node N1 is fixed to a high level voltage, the output signal outz is fixed to a low level, and the output signal outx is fixed to the H level. When the activation signal enb goes low, the transistor Tr3 is turned on, the transistors Tr4, Tr7 are turned off, and the input circuit 1c is activated.

When the voltage of the input signal in is higher than the reference voltage Vref, the node N1 is set to the L level and the output signal outz having the H level and the output signal outx having the L level are output. When the voltage of the input signal in is lower than the reference voltage Vref, the node N1 is set to the H level and the output signal outz having the L level and the output signal outx having the H level are output.

Figure 5:
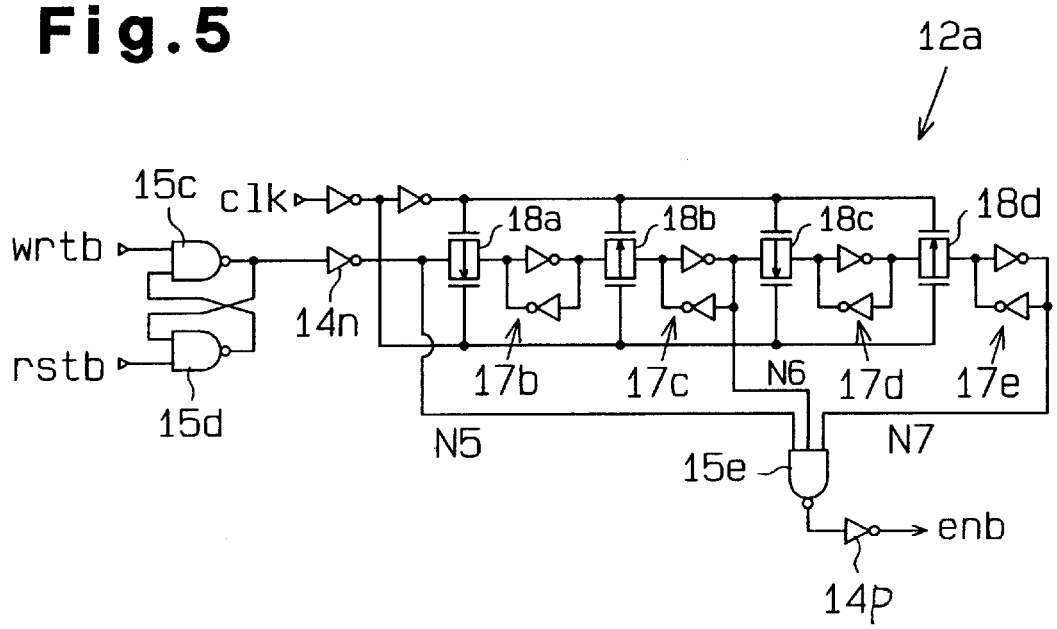
FIG. 5 is a schematic block diagram of an internal circuit of the first-stage control circuit of FIG. 4.

FIG. 4 is a schematic circuit diagram of the first-stage control circuit 12 and FIG. 5 is a schematic circuit diagram of an internal circuit of the first stage control circuit 12. The output signal outx of the input circuit 13a and the output signal outz of the input circuit 13b are supplied to a NAND circuit 15a. The output signal outx of the input circuit 13c and the output signal outx of the input circuit 13d are supplied to a NAND circuit 15b. The output signals of the NAND circuits 15a, 15b are supplied to a NOR circuit 16. Accordingly, the NOR circuit 16 outputs an output signal having the H level when the input signals of the NAND circuits 15a, 15b go high, that is, when a write command WR is supplied.

The output terminal (node N2) of the NOR circuit 16 is connected to the gate of an N-channel MOS transistor Tr8 and to the gate of an N-channel MOS transistor Tr9 via an inverter circuit 14f. The drain of the transistor Tr8 is connected to the drain of a P-channel MOS transistor Tr10 and the source of the transistor Tr10 is connected to the high potential power supply VDD. The drain of the transistor Tr9 is connected to the drain of a P-channel MOS transistor Tr11 and the source of the transistor Tr11 is connected to the high potential power supply VDD.

The source of the transistor Tr8 is connected to the low potential power supply Vss via N-channel MOS transistors Tr12, Tr13 and the source of the transistor Tr9 is connected to the low potential power supply Vss via N-channel MOS transistors Tr14, Tr15. Further, the sources of the transistors Tr8, Tr9 are connected to each other via an N-channel MOS transistor Tr16.

A node N4 at the drains of the transistors Tr8, Tr10 is connected to the drains of an N-channel MOS transistor Tr17 and a P-channel MOS transistor Tr18 and is connected to the gates of an N-channel MOS transistor Tr19 and a P-channel MOS transistor Tr20.

The drains of the transistors Tr17, Tr18 are connected together and the drains of the transistors Tr19, Tr20 are mutually connected. The sources of the transistors Tr18, Tr20 are connected to the high potential power supply VDD. The drains (node N3) of the transistors Tr9, Tr11 are connected to the drains of the transistors Tr19, Tr20 and the gates of the transistors Tr17, Tr18.

A clock signal CLK is supplied to the gates of the transistors Tr10, Tr11, Tr12 and Tr14 via two inverter circuits 14g and 14h. The clock signal CLK is also supplied to the gates of the transistors Tr13, Tr15 and Tr16 via the inverter circuit 14g and two inverter circuits 14i, 14j. The clock signal CLK is supplied to the sources of the transistors Tr17, Tr19 via the inverter circuit 14g, 14i and 14j. The transistors Tr17 to Tr20 enlarge the potential difference between the nodes N3, N4 and cause the rising and falling of voltages of the nodes N3, N4 to be faster.

The voltage of the node N3 is supplied to the gate of a P-channel MOS transistor Tr21 and to the gate of an N-channel MOS transistor Tr22 via the inverter circuit 14k. The voltage of node N4 is supplied to the gate of a P-channel MOS transistor Tr24 and to the gate of an N-channel MOS transistor Tr23 via an inverter circuit 14m.

The sources of the transistors Tr21, Tr24 are connected to the high potential power supply VDD and the sources of the transistors Tr23, Tr22 are connected to the low potential power supply Vss. A signal wrtb is output from the drains of the transistors Tr21, Tr23 and a signal wrt is output from the drains of the transistors Tr24, Tr22. A latch circuit 17a is connected between the drains of the transistors Tr21, Tr23 and the drains of the transistors Tr24, Tr22.

As shown in FIG. 5, the signal wrtb is supplied to a NAND circuit 15c and the output signal of the NAND circuit 15c is supplied to a NAND circuit 15d. A reset signal rstb is supplied from an external device to the NAND circuit 15d. The reset signal rstb is a one-shot pulse signal which falls from high to low when the termination of the write operation is detected based on the control signals /CS, /RAS, /CAS and /WE. The output of the NAND circuit 15d is supplied to the NAND circuit 15c.

The output signal of the NAND circuit 15c is supplied to a transfer gate 18a via an inverter circuit 14n. The transfer signal of the transfer gate 18a is supplied to a latch circuit 17b and the latch signal of the latch circuit 17b is supplied to a transfer gate 18b. The transfer signal of the transfer gate 18b is supplied to a latch circuit 17c and the latch signal of the latch circuit 17c is supplied to a transfer gate 18c. The transfer signal of the transfer gate 18c is supplied to a latch circuit 17d and the latch signal of the latch circuit 17d is supplied to a transfer gate 18d. The transfer signal of the transfer gate 18d is supplied to a latch circuit 17e and the latch signal (node N7) of the latch circuit 17e is supplied to a NAND circuit 15e. The output signal (node N5) of the inverter circuit 14n and the latch signal (node N6) of the latch circuit 17c are also supplied to the NAND circuit 15e. The output signal of the NAND circuit 15e is supplied to the input circuit 1c via an inverter circuit 14p as an activation signal enb.

Each of the transfer gates 18a to 18d operates in response to a signal having the same phase as the clock signal CLK and an inverse signal of the clock signal CLK. That is, the transfer gates 18a, 18c and the transfer gates 18b, 18d are conductive alternatively in accordance with an equi-phase signal and an inverse signal.

Figure 7:
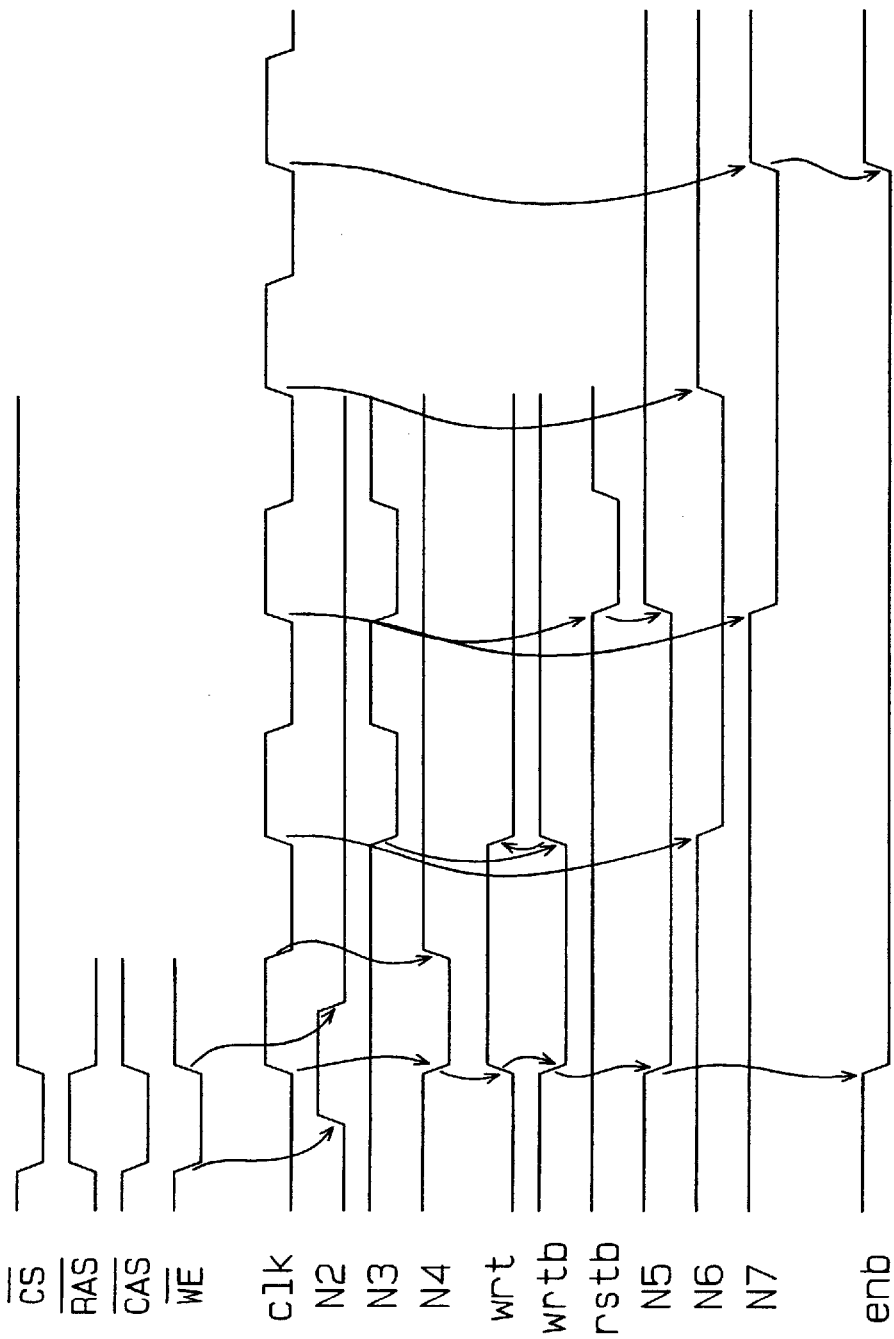
FIG. 7 is a timing diagram showing the operation of the first-stage control circuit of FIG. 4.

The operation of the first-stage control circuit 12 will now be described with reference to FIG. 7.

In the operation mode, except for the write operation mode, since a control signal /WE is high, the output signal of the NAND circuit 15b is high and node N2 is maintained at the L level. Then, the transistor Tr8 is maintained in an off state and the transistor Tr9 is maintained in an ON state.

The transistors Tr10, Tr11 are intermittently turned on by the clock signal CLK. When the clock signal rises, the transistors Tr12, Tr13 and the transistors Tr14, Tr15 are turned on during the operation delay time of one inverter circuit, so that the sources of the transistors Tr8, Tr9 and the low potential power supply Vss are connected. As a result, the node N4 is fixed to the H level and an inverse signal of the clock signal CLK is generated at the node N3. Then, the transistors Tr21, Tr22, Tr23 and Tr24 are all turned off or only the transistors Tr21, Tr22 are turned on, so that a command decision signal wrtb having the H level and a command decision signal wrt having the L level are maintained by the latch circuit 17a.

When the command decision signal wrtb is high, the NAND circuit 15c outputs an output signal maintained at the L level in response to a reset signal rstb at the preceding cycle. Then, the output signal of the inverter circuit 14n is maintained at the H level and signals having the H level are supplied to the NAND circuit 15e. Accordingly, an activation signal enb having the H level is output from the inverter circuit 14p and the third input circuit 1c is maintained in an inactive state.

When write commands, that is, a control signal /CS having the L level, a control signal /RAS having the H level, a control signal /CAS having the L level and a control signal /WE having the L level are supplied to the input circuits 13a to 13d, the node N2 is maintained at the H level during the time which corresponds to the activation time of each control signal. When the node N2 goes high, the transistor Tr8 is turned on and the transistor Tr9 is turned off. In this state, when the clock signal CLK rises, the transistors Tr12, Tr13 are conductive for the operation delay time of one inverter circuit and the node N4 goes low. Subsequently, when the clock signal CLK falls, the node N4 returns to high.

In response to the falling edge of the node N4, the command decision signal wrtb falls and the command decision signal wrt rises. The command decision signals wrtb, wrt are maintained high and low, respectively, until the node N3 falls again. The activation signal enb falls in response to the falling edge of the command decision signal wrtb. Further, the node N5 falls in response to the falling edge of the command decision signal wrtb. The node N6 falls one clock after the falling edge of the node N5 and the node N7 falls one clock after the falling edge of the node N6.

Subsequently, when the command decision signal wrtb returns to the H level and the reset signal rstb falls, the node N5 returns to the H level. Then, the node N6 returns to the H level after one clock and subsequently the node N7 returns to the H level after one clock. Such operation allows the activation signal enb to be maintained at the L level until the node N7 rises after the node N5 has fallen, and the third input circuit 1c to be activated by the activation signal enb.

Figure 8:
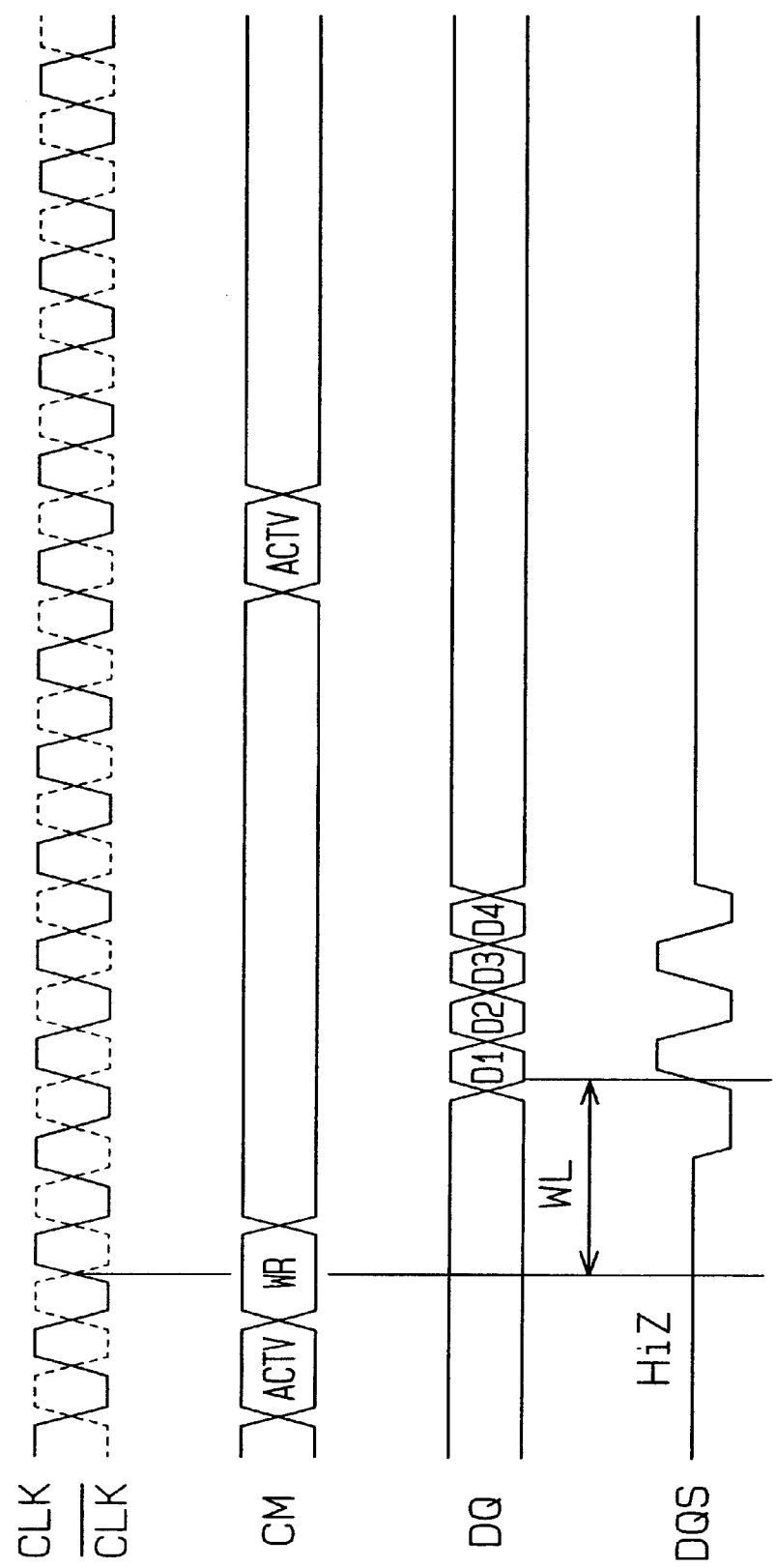
FIG. 8 is a timing diagram showing the write operation of the DDR-SDRAM of FIG. 3.

Next, the write operation of the DDR-SDRAM 200 is described with reference to FIG. 8.

Since the DDR-SDRAM 200 operates in accordance with the clock signal CLK having a higher frequency than that of the conventional DDR-SDRAM 100, the read latency RL is set to "3".

In the write operation mode, a write command WR is supplied from an external device following a word line selection command ACTV. The write command WR is set by setting the control signals /CS, /RAS, /CAS and /WE at predetermined levels. In this embodiment, the latency until the write command WR is supplied after the word line activation command ACTV has been supplied is shorter than the latency until a read command is supplied after the word line activation command ACTV has been supplied.

When a write command WR is supplied, the third input circuit 1c is activated by the first-stage control circuit 12. After the write command WR has been supplied and the lapse of the period of write latency "2", an I/O control signal DQS and write data DQ are supplied from the external device and the write data DQ is acquired by the activated third input circuit 1c.

An address signal AD supplied to the first input circuit 1a is supplied to the predecoder 3 via the FIFO memory 11a. A predecode signal of the predecoder 3 is supplied to the main decoder 4.

A write command WR supplied to the second input circuit 1b is supplied to the control circuit 6 via the FIFO memory 11b. The write amplifier 7 and the main decoder 4 are activated by the output signal of the control circuit 6 and the sense amplifier 5 is activated based on the operation of the main decoder 4.

Conforming to acquisition of write data DQ in this manner, the write amplifier 7 and the sense amplifier 5 are activated and the write data DQ is written to a memory cell selected in accordance with the address signal AD in units of two bits.

The DDR-SDRAM 200 has the following advantages.

(1) By setting write latency WL to 2, even if the first-stage control circuit 12 activates the third input circuit 1c in accordance with a write command WR, the third input circuit 1c surely acquires the write data DQ. Accordingly, power consumption can be reduced by activating the third input circuit 1c only in the write operation mode. In particular, since the number of input circuits for acquiring the write data DQ increases as the number of I/O bits increases, the reduction effect of the power consumption increases.

(2) The write latency WL is set to "2" which is one lower than read latency RL "3". That is, the write latency WL is set to RL−1. Accordingly, the time until the write operation is completed after a word line activation command ACTV has been supplied is decreased without setting the write latency WL longer than necessary while activating the third input circuit 1c in accordance with a write command WR.

(3) The latency until a write command WR is supplied after a word line activation command ACTV has been supplied is set shorter than the latency until a read command is supplied after the word line activation command ACTV has been supplied. Accordingly, even if the write latency WL is set relatively long, the time from the supply of the word line activation command ACTV to the completion of the write operation is decreased. That is, the elongation of write latency is canceled by the latency from the supply of the word line activation command ACTV to the supply of the write command WR.

It should be apparent to those skilled in the art that the present invention may be embodied in many other specific forms without departing from the spirit or scope of the invention. Particularly, it should be understood that the invention may be embodied in a SDR-SDRAM.

Therefore, the present examples and embodiments are to be considered as illustrative and not restrictive and the invention is not to be limited to the details given herein, but may be modified within the scope and equivalence of the appended claims.

What is claimed is:

1. A method for writing data to a semiconductor memory device using an input circuit for write data, comprising the steps of:

supplying a word line activation command to the semiconductor memory device;

supplying a write command to the semiconductor memory device after the lapse of a first predetermined latency period according to a clock signal after the supply of the word line activation command;

activating the input circuit in response to the write command;

acquiring the write data after the lapse of a write latency period after activation of the input circuit; and performing a write operation of the write data supplied to the input circuit, wherein the first predetermined latency period is decreased when the write latency period is increased.

2. The method of claim 1, wherein the write latency period is set so that the input circuit can surely acquire the write data after the input circuit has been activated.

3. The method of claim 1, wherein the semiconductor memory device receives a read command after the lapse of a second predetermined latency period after the supply of the word line activation command, and wherein the first predetermined latency period is shorter than the second predetermined latency period.

4. A method for writing data to a semiconductor memory device using an input circuit for write data, wherein the semiconductor memory device outputs written data upon the lapse of a read latency period after a read command has been supplied thereto, the method comprising the steps of:

supplying a word line activation command to the semiconductor memory device;

supplying a write command to the semiconductor memory device after the lapse of a first predetermined latency period according to a clock signal after the supply of the word line activation command;

activating the input circuit in response to the write command;

acquiring the write data after the lapse of a write latency period after the write command has been supplied to the input circuit; and performing a write operation of the write data supplied to the input circuit, wherein the write latency period is shorter than the read latency period, and wherein the first predetermined latency period is decreased when the write latency period is increased.

5. The method of claim 4, wherein the write latency period is set so that the input circuit can surely acquire the write data after the activation of the input circuit.

6. The method of claim 4, wherein the semiconductor memory device receives the read command after the lapse of a second predetermined latency period after the supply of the word line activation command, and wherein the first predetermined latency period is shorter than the second predetermined latency period.

7. A semiconductor memory device, comprising:

a first input circuit that acquires a write command in accordance with a clock signal;

a second input circuit that acquires write data in accordance with the clock signal;

a write latency setting circuit connected to the first input circuit for setting a write latency period in accordance with the clock signal; and a control circuit connected to the first and second input circuits for activating the second input circuit in response to the write command to acquire the write data after the lapse of the write latency period, wherein the write latency period is set so that the second input circuit surely acquires the write data after the activation of the second input circuit.

8. The device of claim 7, wherein a data read operation is performed upon the lapse of a read latency period after a read command has been received, and wherein the write latency period is shorter than the read latency period.

9. The device of claim 8, wherein the write latency period is shorter than the read latency period by one latency value.

10. A semiconductor memory device, comprising:

a first input circuit that acquires an address signal in accordance with a clock signal;

a second input circuit that acquires various commands including a write command in accordance with the clock signal;

a third input circuit that acquires write data in accordance with the clock signal;

a write latency setting circuit connected to the second and third input circuits for setting a write latency period in accordance with the clock signal; and a control circuit connected to the second and third input circuits for activating the third input circuit in response to the write command to acquire the write data after the lapse of the write latency period after the second input circuit has acquired the write command, wherein the write latency period is set so that the third input circuit surely acquires the write data after the activation of the third input circuit.

11. The device of claim 10, wherein a data read operation is performed after the lapse of a read latency period after a read command is received, and wherein the write latency period is shorter than the read latency period.

12. The device of claim 11, wherein the write latency period is shorter than the read latency period by one latency value.

* * * * *

UNITED STATES PATENT AND TRADEMARK OFFICE
CERTIFICATE OF CORRECTION

PATENT NO. : 6,310,825 B1
DATED : October 30, 2001
INVENTOR(S) : Takaaki Furuyama Page 1 of 1

It is certified that error appears in the above-identified patent and that said Letters Patent is hereby corrected as shown below:

<u>Title page,</u>
Please correct the inventor's residence as follows:
-- [75] Inventor: Takaaki Furuyama, Kasugai (JP) --

Signed and Sealed this

Nineteenth Day of March, 2002

*Attest:*

JAMES E. ROGAN
*Director of the United States Patent and Trademark Office*

*Attesting Officer*

UNITED STATES PATENT AND TRADEMARK OFFICE
CERTIFICATE OF CORRECTION

| | | |
|---|---|---|
| PATENT NO. | : 6,310,825 B1 | Page 1 of 1 |
| APPLICATION NO. | : 09/671647 | |
| DATED | : October 30, 2001 | |
| INVENTOR(S) | : Takaaki Furuyama | |

It is certified that error appears in the above-identified patent and that said Letters Patent is hereby corrected as shown below:

IN THE CLAIMS:

Please amend Claim 10 as follows:

10. A semiconductor memory device, comprising:

a first input circuit that acquires an address signal in accordance with a clock signal;

a second input circuit that acquires various commands including a write command in accordance with the clock signal;

a third input circuit that acquires write data in accordance with the clock signal;

a write latency setting circuit connected to the second and ~~third~~ first input circuits for setting a write latency period in accordance with the clock signal; and a control circuit connected to the second and third input circuits for activating the third input circuit in response to the write command to acquire the write data after the lapse of the write latency period after the second input circuit has acquired the write command, wherein the write latency period is set so that the third input circuit surely acquires the write data after the activation of the third input circuit.

Signed and Sealed this
Twenty-fourth Day of January, 2012

David J. Kappos
*Director of the United States Patent and Trademark Office*

UNITED STATES PATENT AND TRADEMARK OFFICE
CERTIFICATE OF CORRECTION

PATENT NO. : 6,310,825 B1  
APPLICATION NO. : 09/671647  
DATED : October 30, 2001  
INVENTOR(S) : Takaaki Furuyama It is certified that error appears in the above-identified patent and that said Letters Patent is hereby corrected as shown below:

IN THE CLAIMS:

Column 10, lines 12-32,

Please amend Claim 10 as follows:

10. A semiconductor memory device, comprising:

a first input circuit that acquires an address signal in accordance with a clock signal;

a second input circuit that acquires various commands including a write command in accordance with the clock signal;

a third input circuit that acquires write data in accordance with the clock signal;

a write latency setting circuit connected to the second and ~~third~~ first input circuits for setting a write latency period in accordance with the clock signal; and a control circuit connected to the second and third input circuits for activating the third input circuit in response to the write command to acquire the write data after the lapse of the write latency period after the second input circuit has acquired the write command, wherein the write latency period is set so that the third input circuit surely acquires the write data after the activation of the third input circuit.

This certificate supersedes the Certificate of Correction issued January 24, 2011.

Signed and Sealed this  
Twenty-eighth Day of February, 2012

David J. Kappos  
*Director of the United States Patent and Trademark Office*